US007745721B2

(12) United States Patent
Bezzel et al.

(10) Patent No.: US 7,745,721 B2
(45) Date of Patent: Jun. 29, 2010

(54) OPTICAL ELEMENT FOR SHIELDING AGAINST LIGHT

(75) Inventors: Eik Bezzel, Hvalsø (DK); Hanne Lauritzen, Albertslund (DK); Signe Wedel, Copenhagen (DK)

(73) Assignee: Photosolar ApS c/o Teknologisk Institut, Taatsrup (DK)

(*) Notice: Subject to any disclaimer, the term of this patent is extended or adjusted under 35 U.S.C. 154(b) by 1017 days.

(21) Appl. No.: 10/517,424

(22) PCT Filed: Jun. 18, 2003

(86) PCT No.: PCT/DK03/00405
§ 371 (c)(1),
(2), (4) Date: Dec. 20, 2004

(87) PCT Pub. No.: WO03/106802
PCT Pub. Date: Dec. 24, 2003

(65) Prior Publication Data
US 2005/0213233 A1 Sep. 29, 2005

(30) Foreign Application Priority Data
Jun. 18, 2002 (DK) ............................... 2002 00929

(51) Int. Cl.
*H01L 31/042* (2006.01)
*E06B 9/24* (2006.01)

(52) U.S. Cl. ...................................... 136/243; 359/227

(58) Field of Classification Search ................. 136/243; 359/227
See application file for complete search history.

(56) References Cited

U.S. PATENT DOCUMENTS

| | | | | |
|---|---|---|---|---|
| 693,088 | A * | 2/1902 | Wadsworth | 359/596 |
| 3,780,722 | A * | 12/1973 | Swet | 126/680 |
| 3,811,954 | A * | 5/1974 | Lindmayer | 136/256 |
| 4,305,794 | A * | 12/1981 | Davidson et al. | 205/340 |
| 5,877,874 | A * | 3/1999 | Rosenberg | 359/15 |
| 6,376,765 | B1 * | 4/2002 | Wariishi et al. | 136/263 |
| 6,892,011 | B2 * | 5/2005 | Walker et al. | 385/115 |
| 2003/0175625 | A1 * | 9/2003 | Salmi | 430/311 |

FOREIGN PATENT DOCUMENTS

| | | | |
|---|---|---|---|
| DK | DE 19629237 | A1 | 2/1997 |
| DK | PA 1998 01040 | | 8/1998 |
| DK | DE 19737904 | A1 | 3/1999 |
| DK | DE 10024891 | A1 | 11/2001 |
| DK | DE 10034197 | A1 | 1/2002 |
| EP | 0538728 | A1 | 10/1992 |
| EP | 1054289 | A2 | 5/2000 |
| JP | A-7-247765 | | 9/1995 |
| WO | WO 92/16868 | | 10/1992 |
| WO | WO 02/35046 | A2 | 5/2002 |

* cited by examiner

*Primary Examiner*—Kaj K Olsen
(74) *Attorney, Agent, or Firm*—Oliff & Berridge, PLC

(57) ABSTRACT

An optical element (11) in the form of an at least partially transparent face comprises transparent areas and essentially non-transparent areas. The transparent areas are arranged sufficiently close for the intermediate and essentially non-transparent areas to be essentially invisible to the naked eye, at least when the element is viewed from a given distance. The essentially non-transparent areas are arranged sufficiently close and have a sufficient extent at right angles to the face for the intermediate, transparent areas to have such depth/width ratio that the optical element will, at a given point on the face, allow passage of light with given angles of incidence, while light having other angles of incidence are unable to pass the element at the point in question. Hereby an optical element is obtained that is able to better reduce the heating of the interior of a building that is caused by incoming solar radiation without the direct radiation and hence the view being blocked considerably.

19 Claims, 10 Drawing Sheets

OPTICAL ELEMENT FOR SHIELDING AGAINST LIGHT

The invention relates to an optical element in the form of an at least partially transparent face comprising transparent areas as well as essentially non-transparent areas.

Modern buildings are often constructed with large glass fronts. This applies in particular to office buildings, where the individual offices often have windows from floor to ceiling. This presents a number of advantages. On the one hand, a number of degrees of freedom are provided with regard to the architectural appearance of the building and, on the other, very light rooms with good views are provided. However, practice has shown that the large glass panels are also associated with drawbacks. Thus, apart from light rooms, the large amount of incoming light also means that the rooms are heavily heated, since a considerable part of the incident light will be directly incident solar radiation. In particular on hot summer days or in areas with averagely elevated temperatures, the heating of rooms can be so powerful that it is necessary to use considerable energy resources to cool the rooms in question. Also, directly incident solar radiation may also cause inconvenience in the form of blinding to persons who are in the vicinity of the glass panels in question.

A number of solutions are known that aim to reduce the heating and/or the inconvenience in the form of blinding from the directly incident solar radiation. One of the most well-known solutions is curtains that can be drawn on the inside of the individual panes. However, they are associated with the drawback that they also eliminate the view from the relevant room, as usually they are more or less non-transparent. Besides, the fact that they are arranged on the inside means that the heat radiation they are supposed to shield against will still enter and remain in the room, and thus its effect is limited in this regard.

Solar shades or blinds that can be lowered are also known that are arranged on the outside of a building. They typically consist of a cloth of plastics coated glass fibre web. Since they are arranged on the outside of the building, they are more efficient than the internal blinds for reducing heating of the rooms, but these shadings, too, considerably restrict the view from the rooms of the building, as they are only to a limited degree transparent. Besides, they are often avoided for architectural reasons and, likewise, they often require much maintenance to operate satisfactorily. The external shieldings are also sensitive to wind and hence they cannot be used in conditions with heavy wind.

Both of the two above-referenced solutions have the additional drawback that they dim light—and hence heat—to more or less the same extent, irrespective of the angle of incidence of the light in relation to the building. The sun typically producing the most powerful heating when high in the sky, light from points high in the sky will most conveniently be dimmed more than light from lower points such that, in the middle of the day, sunlight will be dimmed considerably, while the view continues to be more or less as usual, eg in the horizontal direction. In principle, this can be obtained with external awnings, but they considerably influence the architectural appearance of the building and for this reason they are often undesirable. Besides, they are—like the above-referenced sunshades—sensitive to wind and they typically require substantial maintenance.

Also Venetian blinds—which are typically arranged on the inside or between two layers of glass—dim light with different angles of incidence differently. Also, the angle of the lamellae in a Venetian blind can usually be adjusted manually, thereby allowing that—to a certain extent—it is possible to choose from which angles of incidence light are allowed to pass and not to pass, respectively, the blind. However, Venetian blinds are associated with the drawback that, due to the size of the lamella, they are extremely visible and thus substantially obstruct the general view through a window provided with a Venetian blind.

Another way of dimming incident sun light is by means of tinted glass panes, eg in the form of a dyeing of the glass or adherence of optical filters directly on the area of glass. These window panes reduce both the directly incident radiation from the sun and the indirect radiation proportionally, irrespectively of the angle of incidence of the radiation. There are no visible shielding elements as such and the view is therefore not obstructed directly, but an indirect influence on the view will occur though, as light from all direction is, as mentioned, dimmed to the same extent. This means that if the shielding against the directly incident solar radiation is to have any effect at all, the window panes will appear to be very dark on days or at times when there is no direct sunlight. Also, these window panes will typically have a tinting that differs from that of ordinary glass panes, whereby the perception of the colour of objects viewed through such pane can be disturbed. The external appearance of a building is also affected when tinted panes are used, but such effect, however, is not necessarily undesired.

Furthermore, Danish patent application DK PA 1998 01040 teaches a solar cell, whose substrate is constituted by a plate of extended metal which, when mounted vertically, is able to shield against the sun without completely shielding against the view through the plate. It is mentioned that if the plate is viewed from sufficiently far away, it will seem to be invisible, but the described plate will not be invisible at the distances that are relevant in a room with the plate mounted on eg a window pane.

It is thus an object of the invention to provide an optical element of the above-referenced kind that is, to a higher degree than the prior art solutions, able to shield against the heating of the interior of a building that takes place due to incident solar radiation without the indirect radiation and hence the view through the element being significantly reduced.

According to the invention this is obtained in that the transparent areas are arranged sufficiently close to each other for the individual, intermediate, essentially non-transparent areas to be substantially invisible to the naked eye, at least when the element is viewed at a given distance that corresponds, however, at most to distances in indoor facilities, and wherein the essentially non-transparent areas are arranged sufficiently close to each other and have a sufficient extent perpendicular to the face for the intermediate transparent areas to have a depth-to-width ratio that causes the optical element to allow, at a given point on the face, light to pass at certain angles of incidence, while light with other angles of incidence are unable to pass the optical element at the relevant point.

Such arrangement of the transparent areas so close to each other that the intermediate areas are more or less invisible in case of usual indoor viewing distances ensures that, from an overall point of view, the element is more or less invisible and thus does not considerably prevent the view through the element. The depth-to-width ratio of the transparent areas precludes light from these angles to travel through the element. Thus, if the element is arranged such that precisely light from the sun when high in the sky is blocked, while light from lower points are allowed to pass, the desired effect is obtained.

The described invention is able to serve as an optical filter having the particular property that its ability to absorb and reflect the light depends on the angle of incidence of the light in relation to the element. For instance, the optical element can be configured and located such that it allows incidence of light when the angle of incidence of light in relation to the element is large, while it effectively absorbs light with a small angle of incidence in relation to the element. In this particular embodiment, the effect is obtained that a vertically arranged element removes considerable amounts of the incoming direct solar radiation, when the intensity of the sun light is high in the middle of the day, while the element allows incidence of light from and view in directions close to the horizon. Thus, the optical element will be perceived as transparent, albeit shielding, for as long as the user views objects that are close to the horizon through the element.

By the invention the effect is obtained that the incoming heat radiation from the sun through the optical element is reduced when the sun is high in the sky in the middle of the day. Simultaneously the invention allows the user to look through the element for as long as the viewing angle is smaller than the limit set therefor, and the element appears as a uniform, coherent face, eg as a plane element. Hereby the invention differs considerably from conventional sun shielding products, such as eg Venetian blinds and lamellae curtains that are, on the one hand, visible as such and, on the other, do not constitute a coherent, uniform face in relation to the pane or the doorway in which such elements are to be mounted.

Since the invention reduces the direct solar radiation into the building, the need to cool the building is considerably reduced, and the optical element will thus be of much value in interaction with the building, as the element lowers the overall energy consumption of the building. In connection with office buildings that often feature a considerable amount of glass panel fronts, the primary energy consumption of the building is closely related to the need for cooling.

The optical element is thus particularly suitable for use as full or partial sun shielding on buildings where the sun-shading effect reduces the need for cooling the building, while simultaneously the element allows the users of the building to see through that part of the facade that is constituted of the element. Of course, the optical element can be used for the same purposes in case of buses, trains, ships or in connection with city-accessories, such as telephone booths and shelters.

The optical element can be configured such that the essentially non-transparent areas constitute a coherent face, whereby the transparent areas appear as openings in this face. This is a convenient embodiment from a manufacturing point of view, since the element can be manufactured from a more or less non-transparent material, in which said openings can be produced, eg by mechanical processing or laser processing. In this embodiment, the element may conveniently be configured such that said openings are elongate, thereby imparting to them, in a given direction in the plane of the face, an extent that is considerably larger than their extent in a direction perpendicular thereto in the plane of the face. Hereby the viewing angle is opened considerably in a plane in parallel with the longitudinal direction of the openings, while the opening angle perpendicular thereto will be limited.

The optical element can also be configured such that the transparent areas constitute a coherent face such that the essentially non-transparent areas appear as islands in this face. It may be eg a transparent basic material on which non-transparent areas are applied.

According to one embodiment of the optical element the transparent areas and the essentially non-transparent areas are arranged in a mutually regular pattern. This yields an element with a well-defined cut-off angle throughout the entire surface.

When the individual transparent areas have, at least in one direction in the plane of the face, an extent that is maximally ten times larger than the extent of the essentially non-transparent areas at right angles to the face, it is ensured that light having small angles of incidence is shielded, while light having larger angles of incidence are able to pass the element.

The transparent areas can preferably be arranged such that the individual, essentially non-transparent areas have an extent that is less than 10 mm at least in one direction in the plane of the face. This means that, when viewed with the sensitivity of a normal eye, they will be practically invisible when viewed at distances in excess of approximately 33 m. If the extent is less than 1 mm, the areas will correspondingly be invisible when viewed from distances in excess of approximately 3.3 m, and if the extent is less than 100 μm the areas will correspondingly be invisible when viewed from distances in excess of approximately 33 cm.

The essentially non-transparent areas of the optical element can conveniently consist of a material with a low reflectivity, whereby light is only to a limited extent reflected from the surfaces of the essentially non-transparent areas. Hereby it is obtained that light reflected from the optical element does not become dominant in relation to light from the surroundings in the directions where the element does not block the light. Hereby it is ensured that the free view in those directions where it is desired is not blocked by reflections from the optical element.

By configuration of the optical element as a film that can be attached to a surface on another at least partially transparent, optical element, a convenient embodiment is obtained, where the element can be arranged on eg the existing window panes of a building, whereby the mounting costs for existing buildings can be reduced considerably.

Configuration of the optical element as an integral part of a window pane, enables an embodiment that is particularly convenient in connection with new building projects, since it is hereby possible to simply mount window panes with the optical element mounted integrally therein.

According to a particularly convenient embodiment of the optical element at least a part of the essentially non-transparent areas are configured to serve as electrode in a solar cell. Hereby the additional effect is obtained that, in additional to shielding against the direct sunlight from the sun when high in the sky, the optical element is also capable of converting the absorbed sunlight into electrical energy. Thus the element is able both to reduce the heating due to incident sunlight—and hence in itself the need for cooling—and simultaneously produce electrical energy that may be used eg for cooling the building. Overall, considerable savings are obtained in the energy consumption of a building that originates in solar heating, while simultaneously the indoor climate in the relevant rooms is not adversely affected.

Said solar cell can conveniently be a photo-electro-chemical solar cell, eg of the type known as Nano Crystalline Dye Sensitized Solar Cells (abbreviated nc-DSC), and in that case the essentially non-transparent areas may comprise a semiconductor on which a suitable dye is adsorbed, and may be configured to serve as photo-electrode in the solar cell. Examples of suitable semiconductors include a metal oxide semiconductor. Alternatively the essentially non-transparent areas may comprise electrically conductive particulate material and may be configured to serve as counter electrode in the solar cell. The particulate material may be eg electrically conductive graphite, particulate semiconductor materials, eg $SnO_2$, particulate metallic materials, such as platinum, or mixtures of the above-mentioned materials.

The optical element may also be combined with a solar-cell function in that the essentially non-transparent areas comprise surfaces that are configured as solar cells. As above, this means that the optical element has both a shielding and an energy-producing effect. In this case, the solar cells can be configured as thin film solar cells.

The invention will now be described in further detail with reference to the drawing, wherein FIGS. 1a, 1b and 1c show an optical element with circular apertures;

Figure 9A:
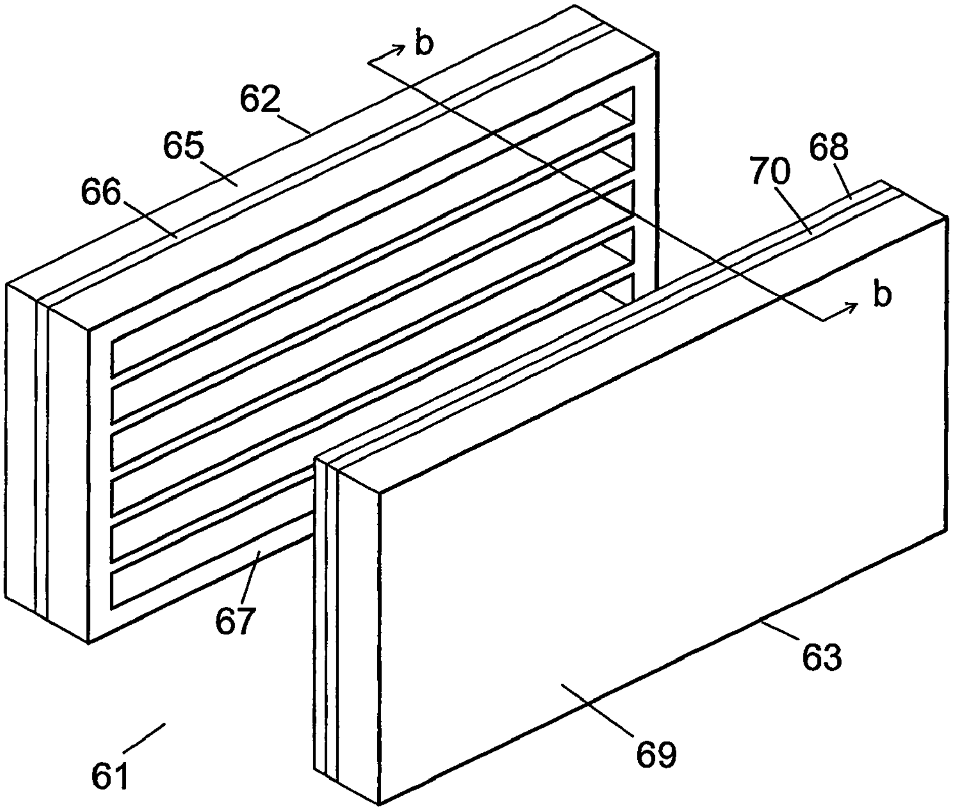
Figure 9B:
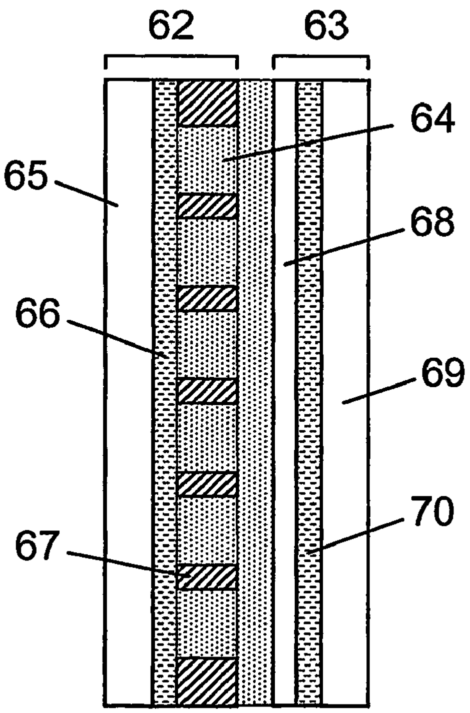
Figure 10:
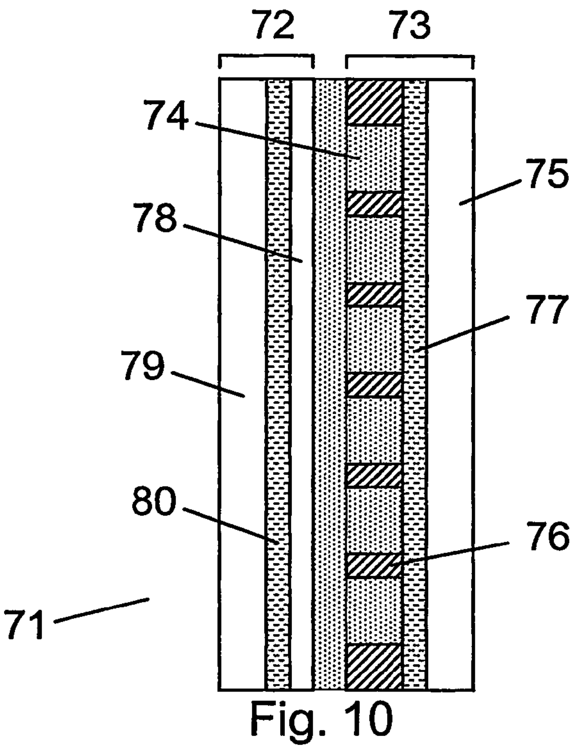
Figure 11:
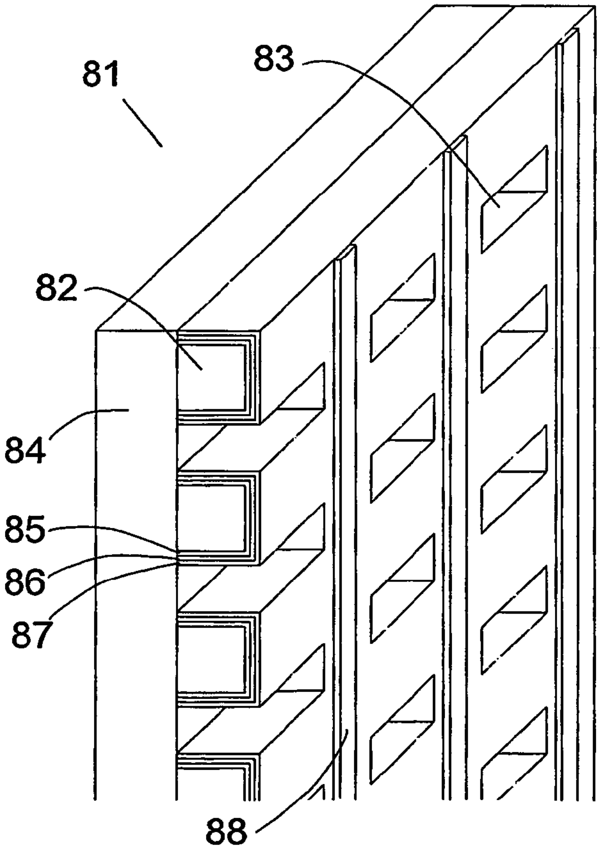

FIGS. 9a-b show a solar cell with a photo electrode configured as a raster plate according to the invention;

FIG. 10 is a sectional view through a solar cell with a counter electrode configured as a raster plate according to the invention;

FIG. 11 shows an optical element, wherein a layer of solar cells is applied to the surface; and FIG. 12 shows an optical element with irregular structure.

Figure 1A:
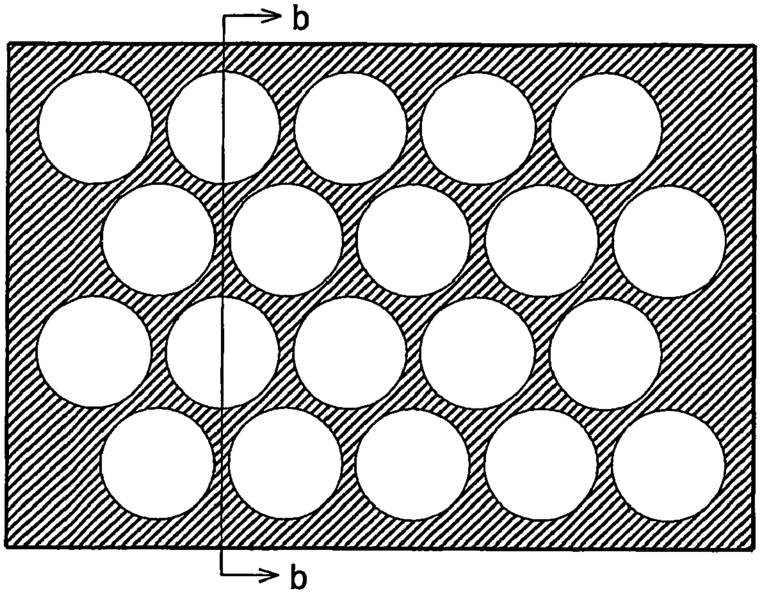
Figure 1B:
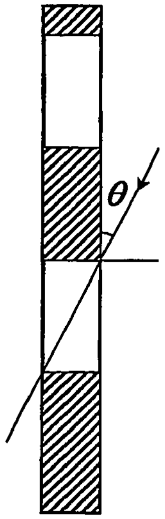
Figure 1C:
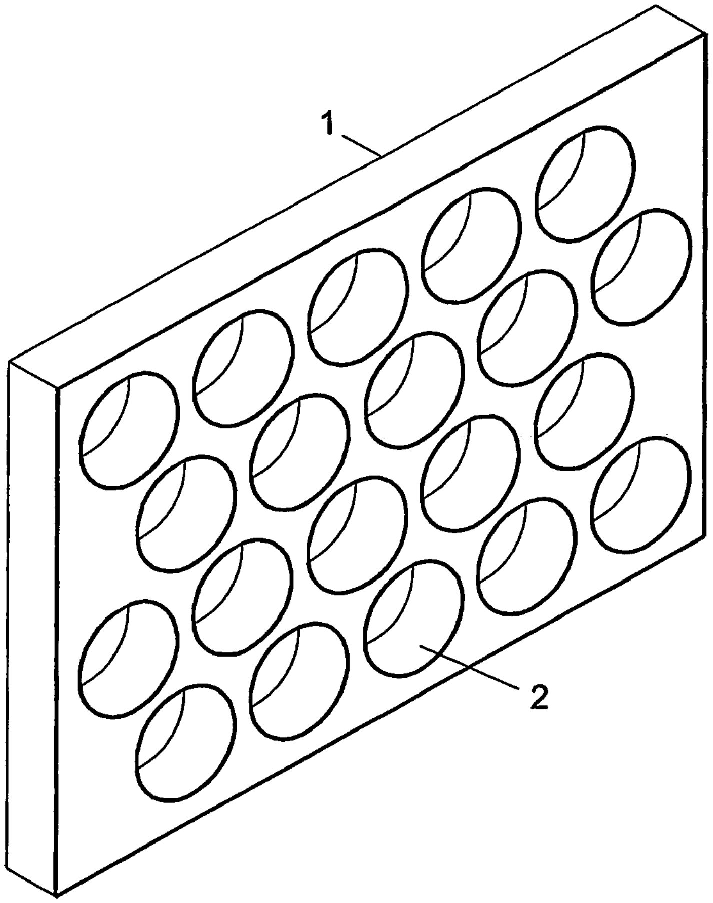

FIGS. 1a-c show an example of an optical element 1 according to the invention. In the example shown the element 1 consists of an essentially non-transparent film or plate material provided with a number of through-going apertures or openings 2 evenly distributed across the area of the plate. Such plate with through-going apertures in a regular pattern will, in the text that follows, be designated a raster plate. In the optical element 1 shown in FIG. 1 the apertures are circular. FIG. 1a shows the plate 1 seen in a view straight from the front, while FIG. 1b is a sectional view along line b-b in FIG. 1a. FIG. 1c shows the optical element 1 seen in a perspective view. The optical element 1 shown in FIGS. 1a-c is shown as a small element with only 20 circular apertures in the plate. In practice, it will usually be much larger plates with far more apertures. Herein, the small plate is used for better illustrating the way in which the optical element works.

If the raster plate is made of an absorbing or reflecting material, a shielding will be obtained that is symmetrical around the face normal of the plate. This means that incoming radiation from eg the sun will be absorbed and/or reflected when it forms a small angle in relation to the raster plate; ie an angle smaller than the angle θ in FIG. 1b, whereas light from larger angles pass right through the apertures 2. This means that the viewing angle through said element 1 is restricted just as much upwards as to each side, if the element is arranged vertically eg in the front facade of a building.

Figure 2A:
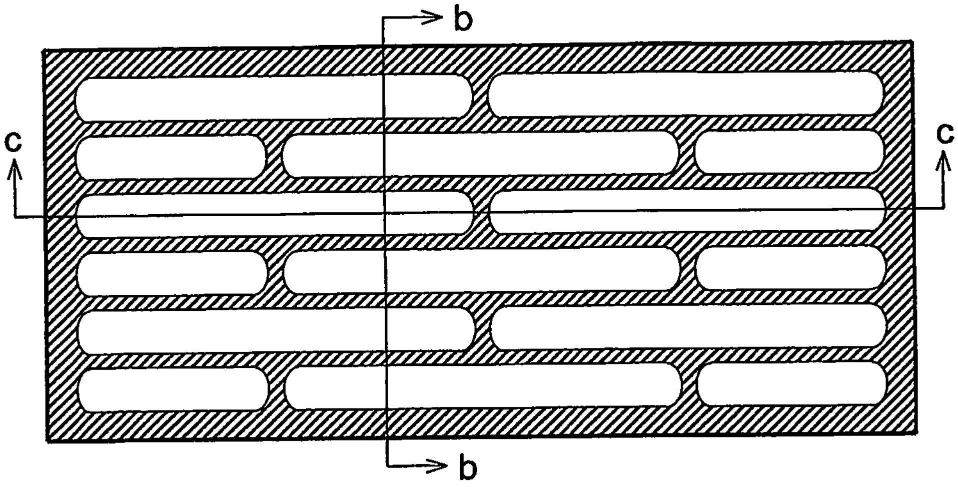
FIGS. 2a, 2b, 2c and 2d show an optical element with elongate apertures.
Figure 2B:
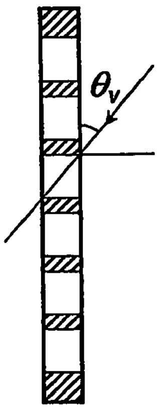
Figure 2C:
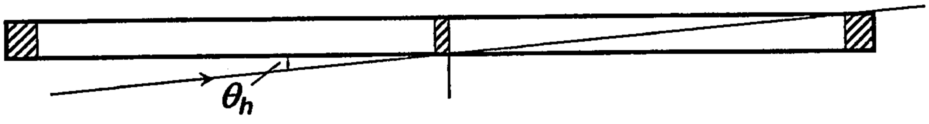
Figure 2D:
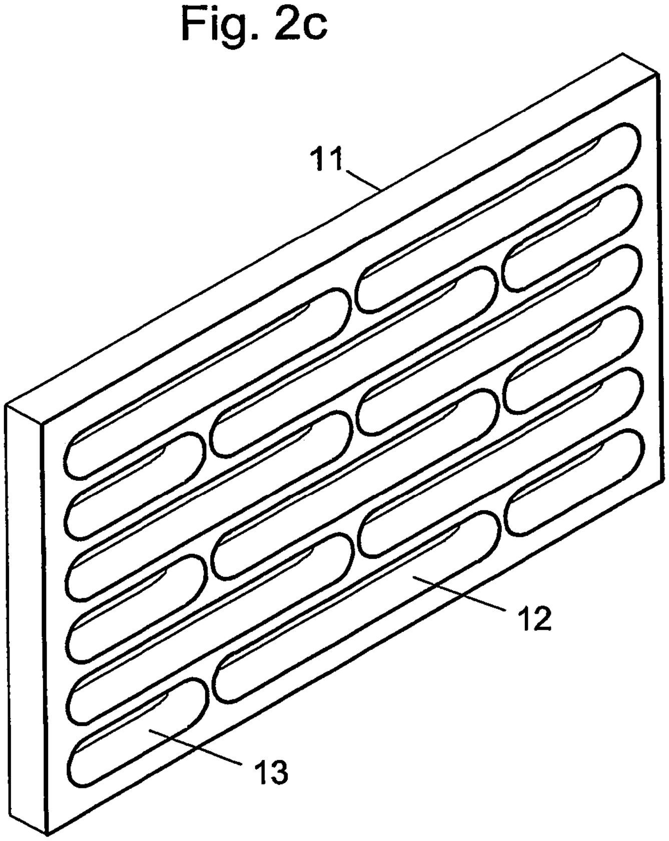

Instead of the circular apertures shown in FIGS. 1a-c, it is also an option to use elongate apertures or channels 12, 13, as shown on the element 11 of FIGS. 2a-d. Also in this figure, FIG. 2a shows the plate in a view seen straight from the front, whereas FIG. 2b is a sectional view along the line b-b shown in FIG. 2a, and FIG. 2c is correspondingly a sectional view along the line c-c shown in FIG. 2a. FIG. 2d shows the optical element 11, seen in a perspective view. If these channels 12, 13 are oriented with the longer side in parallel with the horizon, the light that, in a vertical plane at right angles to the plate, form a small angle to the raster plate—ie an angle smaller than the angle $\theta_v$ in FIG. 2b, will be absorbed and/or reflected, whereas light from larger angles pass straight through the apertures 12, 13, in exact correspondence with the teachings above in relation to the plate 1. In respect of light in a horizontal plane at right angles to the plate, however, it will only be light with an angle of less than the far smaller angle $\theta_h$ in FIG. 2c that is absorbed and/or reflected, whereas light from angles larger than that travels straight through the apertures; ie the viewing angle is opened decisively towards the sides, while the ability of the plate to shield against the sun when it is high in the sky is maintained.

Figure 3:
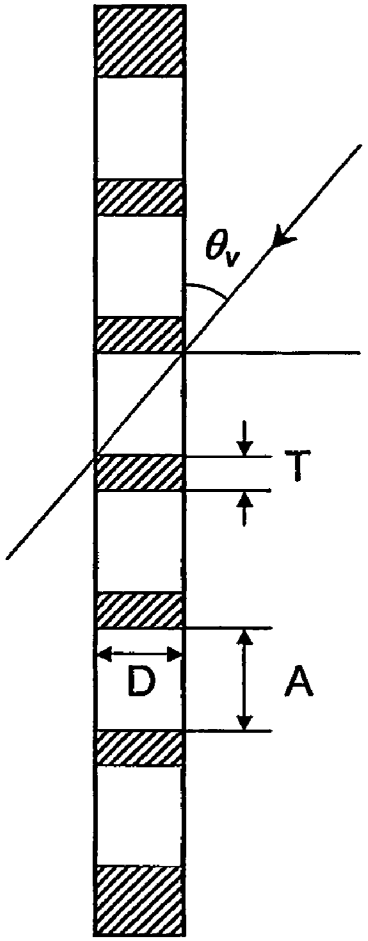

The more specific conditions can be described by the width (A) of the channels, their depth (D) and the thickness (T) of the material between the channels, as is shown in FIG. 3 that corresponds to FIG. 2b. The material between the channels can also be designated micro-lamellae. According to the geometrical optics, a raster plate with micro-lamellae with rectangular cross section will herein have an ability to shield against the direct light given by the ratio between the depth of the lamellae and their mutual distance (D/A). Light having in relation to the raster plate an angle of incidence θ smaller than the critical angle $\theta_v$=arctan (D/A) will hit the lamellae of the raster plate and thus shield the raster plate completely against the direct light. When the angle of incidence of the light exceeds $\theta_v$ and is increased, an increased part of the light will hit between the lamellae and thus manage to travel through the raster plate. Maximal passage of the direct light is obtained when the angle of incidence of the light in relation to the raster plate is 90°. In this situation, the passage of light is determined exclusively of how much of the raster plate is covered by the material between the channels, ie the ratio T/(A+T). For light with an angle of incidence in relation to the raster plate of between $\theta_v$ and 90° the passage of light is determined by the ratio D/A, T/(A+T) and the angle of incidence θ of the light. The passage of light depending entirely on the configuration of the raster plate through the two dimensionless variables D/A and T/(A+T), it can be deduced that the described raster plate shields against the direct sunlight in the same manner as a Venetian blind with corresponding macroscopic lamellae.

However, the conventional macroscopic Venetian blinds have the substantial drawback that, of course, they can be seen with the naked eye and thus they block the view. If, on the other hand, the raster plate is configured with microscopic lamellae, this condition can be changed. The microscopic extent of the pattern in the raster plate makes it possible to supply such qualities to the raster plate that cannot be obtained for conventional sun shielding products, such as Venetian blinds and lamellae curtains, the raster plate appearing—provided it is designed correctly—as a homogeneous face through which it is possible to sense an image of the surroundings located beyond it. In the following it will be described, which requirements this makes to the size and geometrical configuration of the pattern and to the ability of the materials used to absorb and reflect light, including the albedo factor of the materials.

A raster plate will appear as a homogenous face when the pattern in it is so small that the individual lamellae cannot be sensed with the naked eye. The dissolution ability of the eye can commonly be designated by the following simple, empirical correlation:

$$l=3333{,}3\cdot d, \quad (1)$$

wherein I is the distance to the object, and d is the extent of the viewed object. At a viewing distance of 50 cm, the limit for visibility is about 150 μm according to equation (1), which means that an object with an extent of 150 μm will be invisible when viewed from distances in excess of 50 cm. This limit drops to 90 μm when the viewing distance is reduced to 30 cm. Typically, this will thus mean that a window pane in which a raster plate is mounted will, when viewed at a distance, appear as a homogenous face, wherein the individual lamellae cannot be distinguished from the background, if the lamellae have a thickness and depth smaller than about 100 μm.

In the above-mentioned deliberations, the passage of the light is, for the reason of practicalities, described with straight lines and geometrical optics. It is a prerequisite of this deliberation that the areas between the horizontal channels that will have the shape of microscopic lamellae have an extent in all three dimensions that exceeds a critical threshold. A rule of thumb says that this critical threshold is 10 times the wavelength of the light, which in practise is 10 μm for the visible part of the sunlight, whose wavelengths are within the area 400-700 nm. If the characteristic dimensions of the lamellae exceed this critical threshold, the passage of the light through the raster plate can thus be described with straight lines and geometrical optics. Furthermore, the diffraction that occurs due to the wave nature of the light and the character of the raster plate as an optical grid will be minimal and in practice negligible. It can be deduced from this that the lamellae of the raster plate can advantageously be configured such that their depth (D), thickness (T) and horizontal extent and mutual distance (A) all exceed 10 μm. Lamellae that satisfy this requirement to size are designated micro-lamellae in the text that follows. Optical elements whose parts have dimensions below this limit, however, can also be used; only the calculation conditions become more complex.

If, as stated above, the pattern of the raster plate has a characteristic extent that is about 100 μm or less and is hence invisible at the viewing distances in question, the visual impression through the raster plate will not be dominated by its pattern, and hence a primary prerequisite for enabling the sensing of an image through the raster plate has been complied with. Of further consequence to the observation of an image through the raster plate is also light introduced by the raster plate as such.

Through an opening in which the optical element is not mounted an observer is able to see an image of the surroundings, due to objects in the surrounding reflecting a part of the sun light diffusely and transmitting it on in the direction of the observer. This reflection is hereinafter designated the image-forming diffuse reflection from the surroundings, whose intensity ($I_{image}$) depends on how effectively the surroundings reflect the sunlight and hence the intensity of the incoming sunlight. The condition for an observer to be able to see an image of the surroundings is that the intensity of the image-forming diffuse reflection from the surroundings that hit the observer is dominating in relation to the intensity of other light radiation with corresponding direction that hits the observer. The condition for the observer to see an image through the raster plate is thus that the light intensity introduced by the raster plate in the direction of the observer ($I_{raster\ plate}$) is not dominating in relation to the image-forming light intensity. The quality of the observed image will depend on the intensity ratio $I_{image}/I_{raster\ plate}$.

The raster plate introduces two possible sources of light radiation in the direction of an observer present in the room behind a window pane in which the raster plate is mounted, viz the light reflected from the lamellae and light not reflected by the lamellae, but rather travelling through the lamellae without being completely absorbed. The light that hits the lamellae will be partially reflected and partially penetrate the lamellae material. How much of the intensity of the sunlight that is reflected depends on the albedo factor of the lamellae. The intensity fraction that is not reflected will wander into the lamellae, where it is gradually absorbed by the lamellae material.

Figure 4:
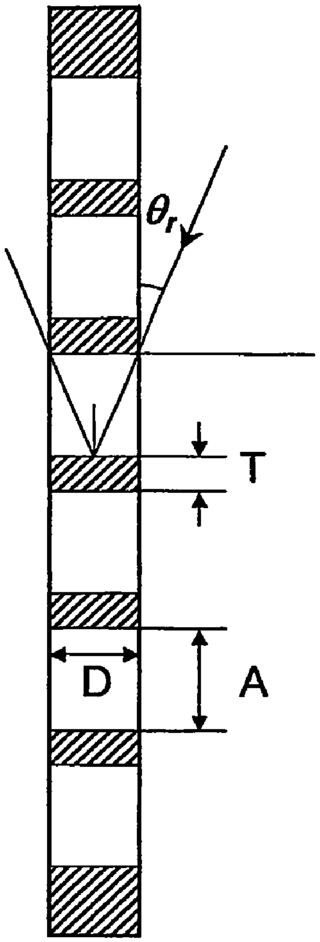

The direction of the reflected light depends on the character of the lamellae surface. If the surface of the lamellae is perfectly plane, also on a microscopic scale, the light is reflected in accordance with the fundamental rules of geometrical optics that say that the angle of incidence of light equals the angle of excidence of the light, wherein both angles are measured in relation to the horizontal plane of the lamella. On the basis of this and a simple geometrical deliberation, it will appear that the raster plate will, under the given conditions, allow reflected light of the first order to pass when the angle of incidence θ in relation to the raster plate exceeds the angle $\theta_r=\arctan(D/(2\cdot A))$. This is also illustrated in FIG. 4. In the same manner it will appear that the raster plate allows reflected light of the (n−1)th order to pass when the angle of incidence θ exceeds the angle $\arctan(D/(n\cdot A))$, wherein $n\geqq 1$. The intensity of the reflected light allowed to pass through the raster plate thus depends on the angle of incidence and intensity of the sunlight, number of reflections, the albedo factor (ρ) of the lamellae and the configuration of the lamellae that again appears through the dimensionless ratio D/A.

If, conversely, the surface of the lamellae is perfectly diffusing, the reflection of the light can be described as approximately uniform in all directions. From a geometrical view, it can be shown in this case that the portion of the diffusely reflected light intensity allowed to pass through the blind is independent of the extent of the lamellae, but, conversely, dependent on their geometry in the form of the ratio D/A. The amount of diffusely reflected light allowed to travel through the raster plate is increased when the ratio D/A decreases. Apart from this, the amount of light allowed to pass through the optical element also depends on the angle of incidence of the sunlight and the albedo factor of the lamella.

In order to avoid that light travels through the thickness of the lamellae without being completely absorbed, the lamellae can be manufactured from a material or a combination of materials that has a sufficiently high absorption of light within the relevant wave length area of 400-700 nm. Absorption of the light in a given material can be described with the following relation:

$$I(t)=I_0\exp(-\beta\cdot t), \qquad (2)$$

wherein I(t) is the light intensity after having traveled a distance t through the material, $I_0$ is the intensity of the light penetrating into the material, and β is the absorption coefficient of the material or extinction coefficient for light in the relevant wave length range. As it has earlier been stated that the thickness (T) of the lamellae or generally the distance between the apertures in the raster plate may conveniently be between 10 μm and 100 μm, this means that the raster plate is either manufactured from a material having an absorption coefficient for visible light in the range between the two values given below:

$$\beta>2{,}3\cdot 10^3\ \mathrm{cm}^{-1} \text{ for } T=10\ \mu m,$$

$$\beta>2{,}3\cdot 10^2\ \mathrm{cm}^{-1} \text{ for } T=100\ \mu m,$$

or alternatively that the raster plate is manufactured from a combination of two or more materials that combine to provide sufficient absorption of the visible light across the thickness of the lamella. In case of micro-lamella, this can be accomplished in that the lamellae are constructed around a metal core, since metals effectively absorb all light over a distance of 0.1 μm.

The raster plates shown in FIGS. 1 and 2 are merely examples of how a raster plate according to the invention can be configured. A number of alternative examples will be discussed below.

Figure 5A:
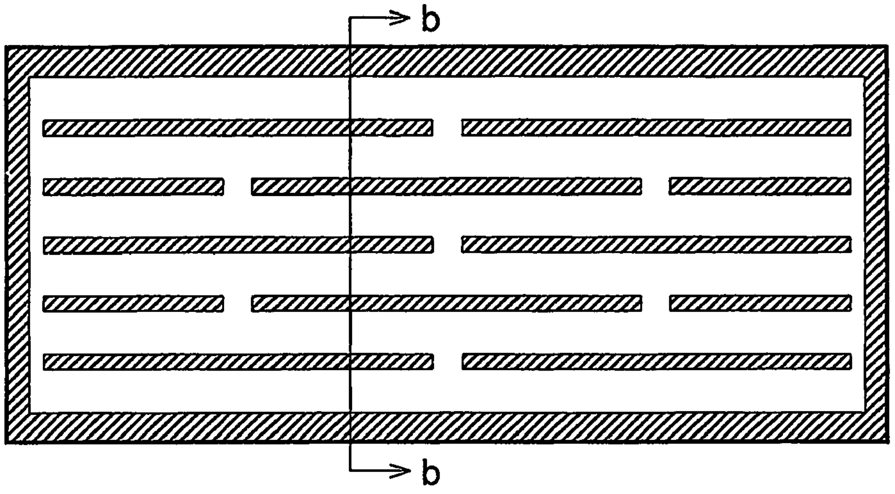
FIGS. 5a, 5b and 5c show an optical element, wherein non-transparent islands are used.
Figure 5B:
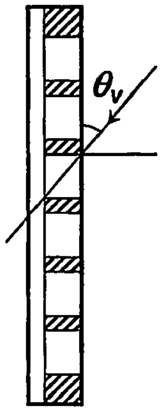
Figure 5C:
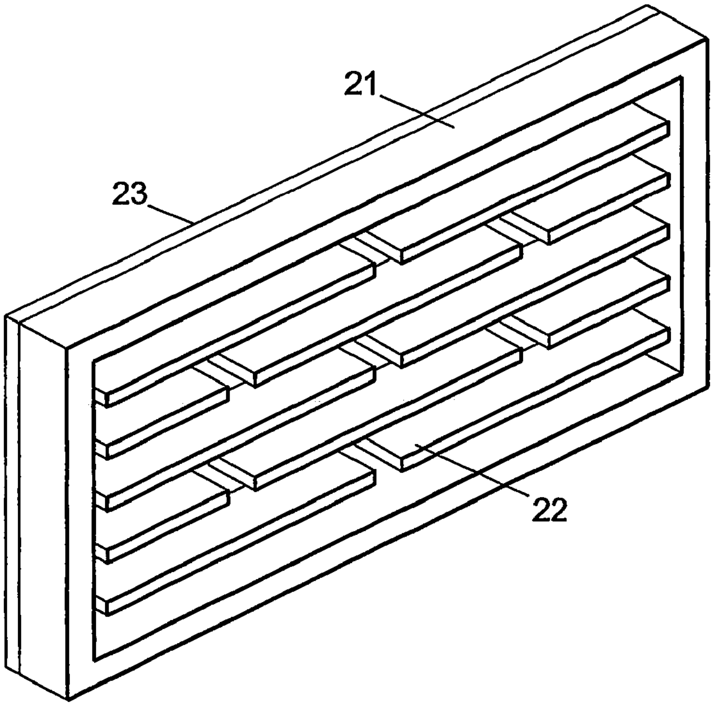

The plate 21 shown in FIGS. 5*a-c* corresponds to the one shown in FIGS. 2*a-d*; however, instead of the elongate apertures 12, 13 the channels are herein defined by means of a number of non-transparent "islands" 22 that are attached to a transparent layer 23, eg in the form of a film or a glass plate. The functioning is the same as for the plate 11, although a small part of the light from the sun when it is high in the sky will be allowed to pass through the small apertures between the elongate "islands". This may be advantageous, since it will still be possible to sense the location of the sun through the optical element, albeit by far the major part of the direct radiation—and hence the heating—is avoided.

Figure 6A:
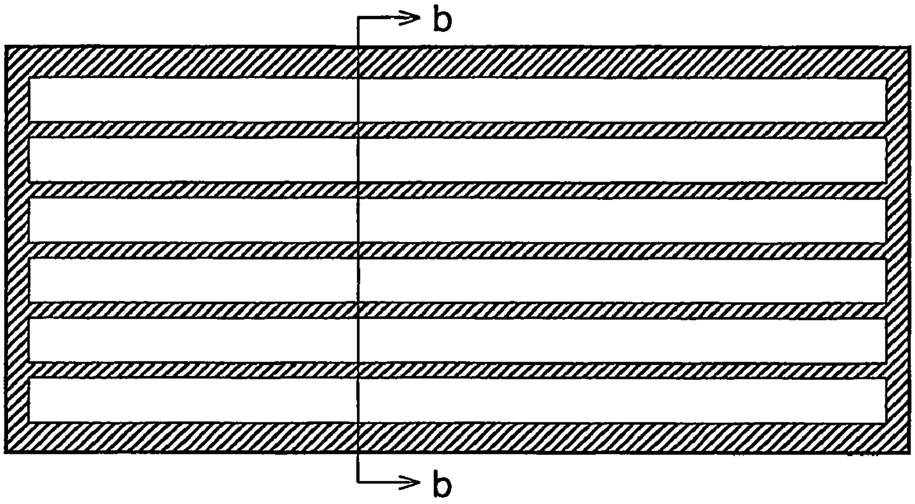
FIGS. 6a, 6b and 6c show an optical element, wherein channels extend in the entire width of the element.
Figure 6B:
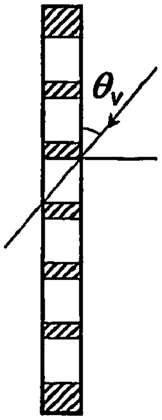
Figure 6C:
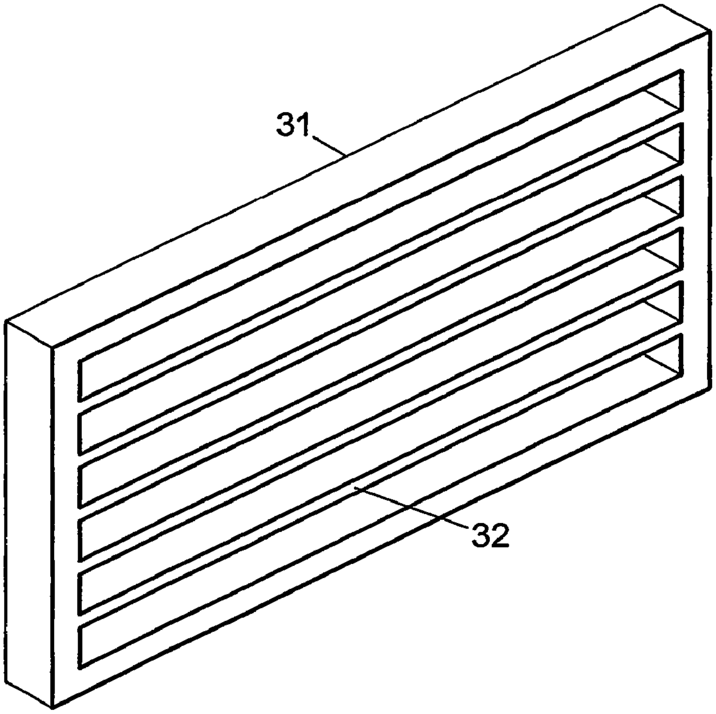
Figure 7A:
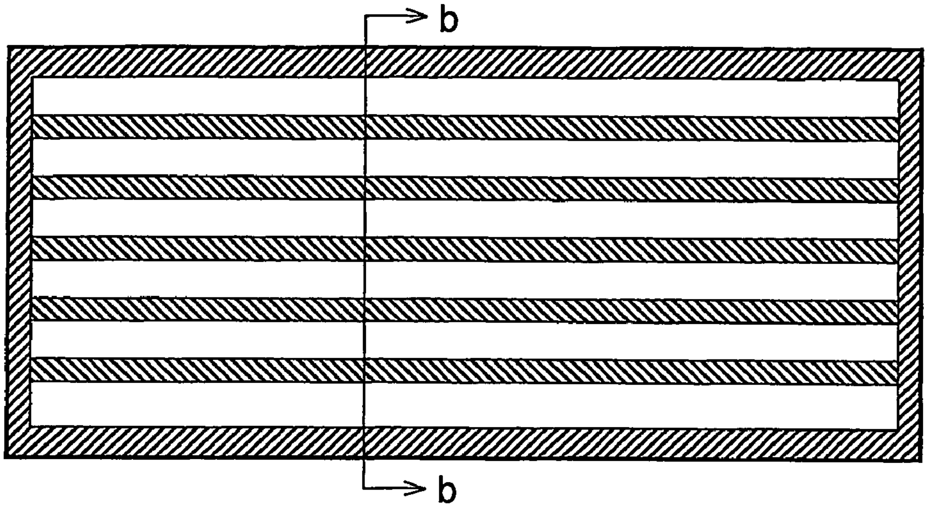
FIGS. 7a, 7b and 7c show an optical element, wherein the individual lamellae are of triangular cross section.
Figure 7B:
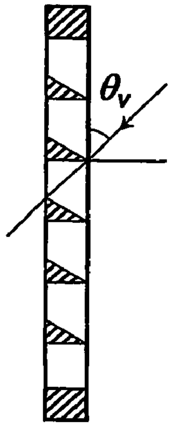
Figure 7C:
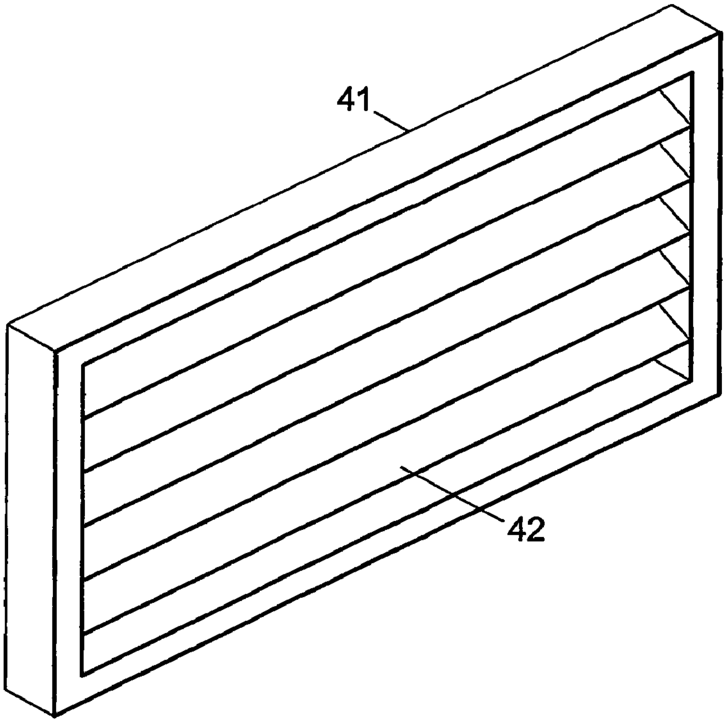
Figure 8A:
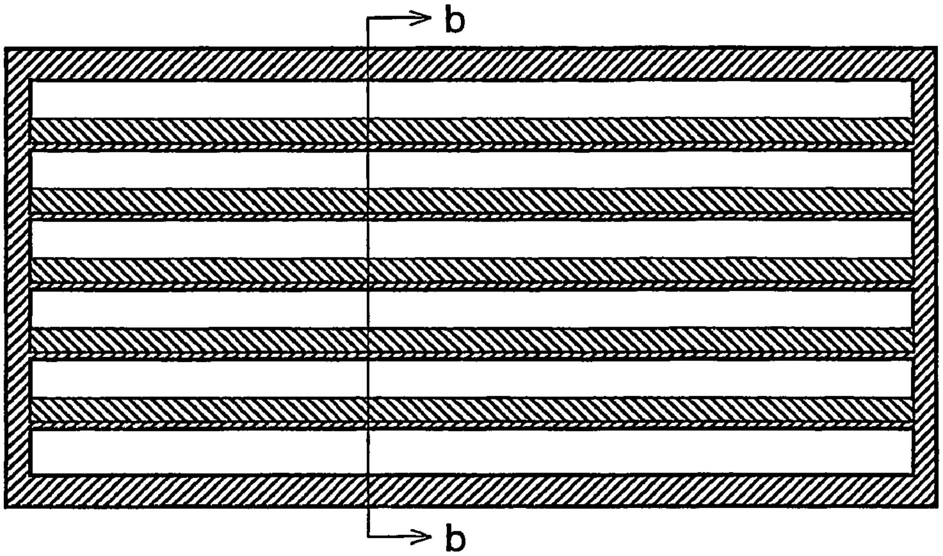
FIGS. 8a, 8b and 8c show an optical element with tilted lamellae.
Figure 8B:
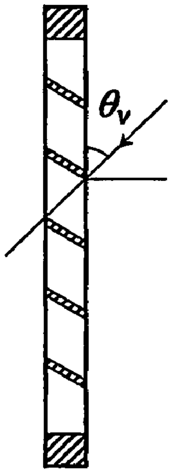
Figure 8C:
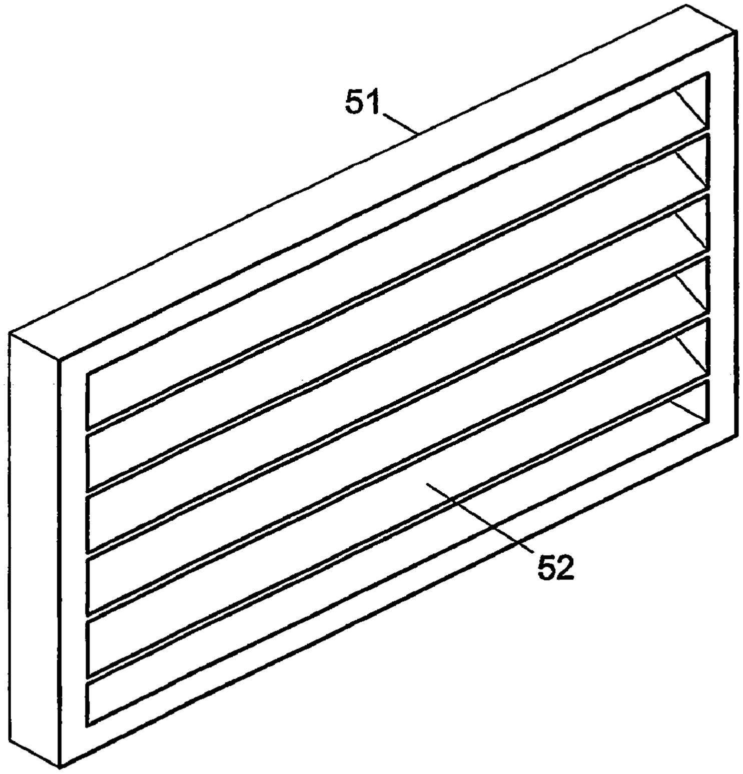

If the apertures 12, 13 in the plate 11 or the "islands" 22 in the plate 21 are configured to be so long that they extend across the entire width of the plate, the result is like the plate 31 shown in FIGS. 6*a-c* that consists of a number of lamellae 32 that corresponds to a Venetian blind with horizontally arranged lamellae; only the lamellae are herein configured with a microscopic size as will appear from the above-mentioned deliberations concerning the ratios. The lamellae 32 are shown with rectangular cross section, but as shown on the plate 41 in FIGS. 7*a-c*, it is an option also to use lamellae 42 with a triangular cross section, which enables an improved view in the downwards direction without deteriorating the shielding of the sunlight. Finally, FIGS. 8*a-c* show a plate 51 in which tilted lamellae 53 are used. The functioning corresponds to that of the plate 41 with the triangular lamellae, but in this case an even better view is provided in the downwards direction. The triangular and the angled lamellae further provide the advantage that a large part of the light reflected from the lamellae will be reflected outwards rather that inwards as described above, where it might influence the visual impression. These embodiments thus considerably reduce the reflection problem.

As mentioned, all of the above described raster plates distinguish themselves by the microscopic extent of the individual lamellae, apertures or "islands" that define the pattern on the raster plates. Therefore such elements can be manufactured by means of micro-technical methods, such as eg laser processing, selective etching or micro-technical processing. It is a common feature of these methods that the degree of difficulty of the manufacturing process increases in pace with the ratio of detail depth to thickness. Therefore the manufacturing process can be facilitated by selection of a convenient T/D ratio of the lamellae that should therefore not, for reasons of manufacture, exceed a critical threshold given by the selected method of manufacture. For instance, the raster plate as such may, when manufactured by one of said methods, be located on a transparent carrier film that can subsequently be adhered to a window pane in a building to obtain the intended effect. As it is exemplified in case of the plate 21 shown in FIG. 5, the carrier film may also be a part of the method of manufacture as such. Alternatively the thus produced raster plate can be integral with a glass pane, thereby enabling the pane to be mounted directly in a building.

As mentioned, the above-described raster plates can be used as optical shielding elements, eg against powerful sunlight, but they may additionally be provided as a monolithic structure that constitutes a part of a solar cell. The plate can be manufactured as a part of an element, eg a substrate, wherein both the raster plate and the substrate may perform other functions in relation to the functioning of the solar cell. For instance, the raster plate may serve as rear electrode for a coating of amorphous Si, or the raster plate may be a carrier substrate for a nano-structured photo-electrode in a photo-electro-chemical solar cell, also designated Nano Crystalline Dye Sensitized Solar Cells (abbreviated nc-DSC). By this type of solar cell the formation and transport of charge carriers take place in separate materials; sensitizer and semiconductor electrode, respectively. Furthermore, this type of solar cell sometimes contains components that are not solids. This type of solar cells and methods for the manufacture of same are well-known.

If an ns-DSC solar cell is combined with the above-described raster plates, it is possible to manufacture a solar cell panel that could be perceived as partially optically transparent, and that a user will be able to look through. This type of solar cell panel may also be framed in the climate envelope of a building and can be used as an architectural element that reduces the total amount of light coming in through the solar cell panel.

An nc-DSC solar cell consists of a photo-electrode and a counter electrode that are both in electronic contact with a commonly liquid electrolyte. The electrolyte consists of a redox ion pair dissolved in a suitable solvent.

The photo-electrode consists of a semi-conductor material, on which a dye is absorbed that can be excited from its electronic ground state upon illumination. Usually the semi-conductor material is configured such that the electrode achieves a large physical area, and the semi-conductor material and hence the above-mentioned dye is brought into electrical contact with an electrically conductive material that serves as contact to an external electrical circuit.

Usually, the counter electrode consists of an electrically conducting material, on which a catalytically active material is adsorbed. The functioning of the catalytic material is to contribute to the reduction of the redox pair in the electrolyte, whereas the conductive material merely serves as contact to the external electrical circuit.

Overall, the solar cell functions in that one of the photons of the sunlight interacts with the dye adsorbed onto the surface of the semiconductor material on the photo-electrode and hereby strikes an electron in the dye from its original state. If this electron thus obtains an energy level that exceeds the energy level of the conduction band of the semiconductor material, this electron can be injected onto the semiconductor material. The electron can thus be moved through the semi-conductor and to the electrical conductor connecting the photo-electrode to the external electrical circuit. The dye is reduced to its original state by receiving an electron from the reduced form of the ion pair that constitutes the redox pair in the electrolyte. The thus oxidised ion is moved through the electrolyte to the surface of the counter electrode, where the ion is yet again reduced by receiving an electron from the counter electrode. The interaction of the dye with the sunlight will thus produce a voltage between photo- and counter electrode, and provided both of these electrodes are connected to the same external electrical circuit, current may run between the above-mentioned electrodes, and this current can be used to perform an electrical task in the external circuit.

FIGS. 9*a-b* show examples of how a solar cell 61 according to the invention can be constructed. The shown solar cell uses a photo-electrode configured as a raster plate corresponding to the plate 31 in FIG. 6*c*. FIG. 9*a* shows the solar cell in a perspective view, while FIG. 9*b* is a sectional view along the line b-b in FIG. 9*a*. In FIG. 9*a* the two halves of the cell are shown separate from each other in order to better illustrate the structure of the cell. As will appear, the solar cell 61 consists of two halves; a photo-electrode part 62 and a counter electrode part 63, wherein the electrolyte 64 is arranged between the two halves.

The starting point for the solar cell is a glass substrate 65 coated with a transparent, conductive coating 66 and optionally a web of an electrically conductive material. On the conductive side of the substrate, a layer 67 of nano-particulate $TiO_2$ is applied, eg a suspension of commercial $TiO_2$ powder in suitable solvent. The thickness of the applied layer 67 must exceed the desired lamella depth; eg >20 μm. Application of this layer of $TiO_2$ particles is a well known technology in the manufacture of nc-DSC solar cells and can be effected eg by scraping, screen printing or the like.

Before the applied $TiO_2$ paste dries, the desired lamella structure can be accomplished by the coating 67 being scraped with a particular cutter means intended therefor having a blade with such profile that it corresponds to a negative imprint of the desired shape. With this simple technique it is possible to essentially remove the material between the ribs desired to be formed. Thus, it is possible to form a profile, eg corresponding to the raster plate 31 shown in FIG. 6. The distance between the ribs (A) can be eg 50 μm, the thickness of the ribs (T) 10 μm and the depth of the ribs (D) 20 μm.

From here on the formation of the nc-DSC solar cell is as usual for this type of cells. The most essential steps are thermal sintering of the constructed electrode 67 at a maximum of 450° C.; formation of a counter electrode 68 on a separate substrate of glass or plastics 69, wherein there is provided, like on the glass substrate 65, a transparent, conductive coating 70; impregnation of the photo-electrode with suitable sensitizer; assembly of photo- and counter electrode with a suitable edge sealing; and finally charging of a liquid electrolyte 64. The given sequence of these processes can be deviated from in response to selection of edge sealing and manufacturing technique for the catalyst on the counter electrode. By the given process both substrates conveniently have mechanically sufficient carrier capabilities so as to avoid that they deform the structure thus formed in the photo-electrode, and a transparent catalyst is used on the counter electrode, eg a thin platinum coating.

In this example the sun-shielding effect originates in the photo-electrode, and consequently this material should, as mentioned above, have an extinction coefficient in excess of about $2 \cdot 10^3$ $cm^{-1}$ through the visible spectre. This requirement is met by dye sensitized nano-particulate $TiO_2$.

With the above-stated dimensions the lamella structure allows more than 50% of the indirect light from the surroundings pass through, and furthermore the intensity of the through-passing, image-forming light from the surroundings is more than twice the intensity of the diffuse reflection from the lamellae, if the albedo factor (ρ) of the lamella is less than about 0.18. Additionally, the ratio of the lamellae depth to their thickness is less than 3, which yields a reasonable producibility.

FIG. 10 is a sectional view through a further solar cell 71, wherein it is, however, the counter electrode that is configured as a raster plate corresponding to the plate 31 in FIG. 6*c*. This time, too, it is an nc-DSC solar cell which is, in this case, manufactured by structuring of the counter electrode. As will appear, also the solar cell 71 consists of two halves; a photo-electrode part 72 and a counter electrode part 73, wherein an electrolyte 74 is arranged between the two halves. The manufacture takes its starting point in a transparent substrate 75, eg glass or plastics. This is applied with a thick film of electrically conductive graphite 76 (optionally with an interjacent conductive layer 77 of a transparent material). This can be accomplished by application of a paste of graphite particles in a suitable suspension, eg butyl acetate or the like. Manufacture of such emulsions on plane substrates is known. Application can be performed by scraping, rolling or the like methods.

The thus formed graphite electrode 76 on the substrate in question constitutes an electrically conductive and catalytically active coating that can serve as counter electrode in an nc-DSC solar cell.

The structuring of the counter electrode 76 can be performed either as stated for the photo-electrode above by mechanical removal of the graphite coating such that the desired geometry appears, or it can be performed by removal of the graphite coating by means of a laser. In case of laser processing of the graphite electrode the illuminated area is transformed to CO and $CO_2$ if the processing takes place in an oxygen-containing atmosphere. Laser processing is a known technology within the processing industry and it is characterised by high speed and accuracy.

The counter electrode is formed such that it shapes the desired geometry 76 and it constitutes in itself the directionally selective element of the solar cell.

In this example the photo electrode 78 can be performed exactly as usual for this type of solar cells; all it takes is that the electrode can be manufactured from fully dispersed nanoparticles that constitute a non-visible film on the substrate. The starting point is a transparent substrate 79, eg glass. The glass is coated with an electrically conductive layer, eg a TCO, and optionally an electrically conductive web 80. Then a thick film 78 of nano-crystalline $TiO_2$ particles is added, of which no particles should be larger than about 30 nm. These particles are considerably smaller than the wave length of visible light, and therefore they appear to be transparent provided the particles are sufficiently dispersed. The thickness of the photo-electrode should be about 10 μm, and this can be obtained by usual methods.

Application of sensitizer on the photo-electrode, assembly of photo- and counter electrode, sealing and addition of electrolyte 74 can be performed by the usual routines that depend on the exact choice of material.

In the above-referenced examples the angle-sensitive optical element partakes in the form of a raster plate as an integral part of a solar cell, viz as either photo-electrode or counter electrode in an nc-DSC solar cell. It should be noted that, of course, it is also an option to allow a part of the raster plate only to serve as electrode in a solar cell, while the remainder of the raster plate is then to function merely as shielding element as described above.

It is also an option to arrange one or more solar cells on the surface of such raster plate, whereby the raster plate—in addition to providing the angle-sensitive effect—merely functions as the carrier element for the solar cell. In this case it is possible to use eg solar cells manufactured by means of thin-film technique that differs considerably from a technological point of view from the conventional types. Thin-film solar cells comprise a very wide range of different types, eg microcrystalline silicon, amorphous silicon or a CIS-type (Conductor-insulator) solar cell, eg CIGS (Copper Indium Gallium Selenide) or GaAs (Gallium Arsenide).

An example of this is shown in FIG. 11 that shows a unit 81 comprising a raster plate 82, on the surface of which a solar cell layer is applied. The raster plate 82 is shown herein with rectangular cut-outs 83, but apart from that it corresponds to the plate 11 shown in FIGS. 2*a-d*. The raster plate 82 is arranged on a transparent substrate 84, and the raster plate itself can be manufactured with a starting point in an optically blocking material, eg plastics, ceramics, metal or combinations thereof. This material can be processed as described below, such that rectangular cut-outs are formed having the desired shape and size. Thus the grid 82 is formed that describes the angle-sensitive property. The grid 82 is subsequently coated with an electrically conductive coating 85 and one or more coatings that combine to constitute a solar-cell active material 86. Furthermore, it may be necessary to add a layer of transparent, conductive coating 87 and a grid of thin lines manufactured from electrically conductive material 88. Usually it will be necessary to locate the thus manufactured angle-sensitive solar cell between two transparent substrates, whereby—in addition to the transparent substrate 84—a corresponding substrate is also arranged on the opposite side of the unit.

The material from which the raster plate is manufactured is to comply with the above-given requirements to extinction coefficient. To most metallic or ceramic materials this requirement will readily be complied with for all practically usable thicknesses. The processing of the material with a view to obtaining the desired structuring can be accomplished by micro-mechanical processing, eg spark machining or laser processing of metallic materials. For materials that can be described as ductile the processing can be accomplished by edge-punching cracks of desired length and subsequently stretching the material transversally to the cracks. In this manner a regular pattern can be formed.

If a structured ceramic material is used, the manufacture is accomplished by rolling a ceramic film to a thickness that corresponds to the desired geometry, eg 200 μm. It is perforated mechanically by punching, while the film is yet workable (un-sintered work piece). The perforation may be a width of eg 200 μm and a length that considerably exceeds this dimension, eg 1 mm. The thus structured ceramic green/unfinished piece is subsequently sintered in a conventional manner, following which conductor tracks, barrier coatings and solar-cell active materials are applied, eg microcrystalline silicon in accordance with usual methods.

It is also an option to use a polymer material. Manufacture of a structured polymer piece can be performed by micro-injection moulding, laser processing or mechanical punching. It is possible to use a polymer material dyed in the mass or a transparent material onto which a non-transparent coating is applied following perforation. Subsequently the material can be used as starting point for the manufacture of thin-film solar cells in accordance with the usual methods, ie by use of low-temperature processes.

If a metallic material is used, one concrete example is laser processing of an alu-foil with a thickness of 10 μm. With the laser it is possible to form channels in the foil that have a width of 10 μm, wherein the length of the channels decisively exceeds the width. The thus structured film can subsequently be used as a piece for application of thin-film solar cell, eg micro-crystalline silicon, amorphous silicon or a CIS type (Conductor-Insulator) solar cell, eg CIGS (Copper Indium Gallium Selenide) or GaAs (Gallium Arsenide). Irrespective of the type selected, the subsequent manufacture of the solar cell will follow the techniques and methods that are usual for the manufacture of the selected type of solar cell. In this case, where a grid is used that is manufactured form a metallic material, the conductive coating 85 is not a prerequisite, as the grid itself possesses this property.

In each of the above instances it may be necessary to provide a number of coatings between the grid and the solar-cell active material. The necessity of these is determined by the exact construction of the solar cell, wherein particular cases may dictate a need for barrier coatings and the like. They are not included in the shown illustrations. Likewise, the solar cell layer as such may be a combination of several layers.

Figure 12A:
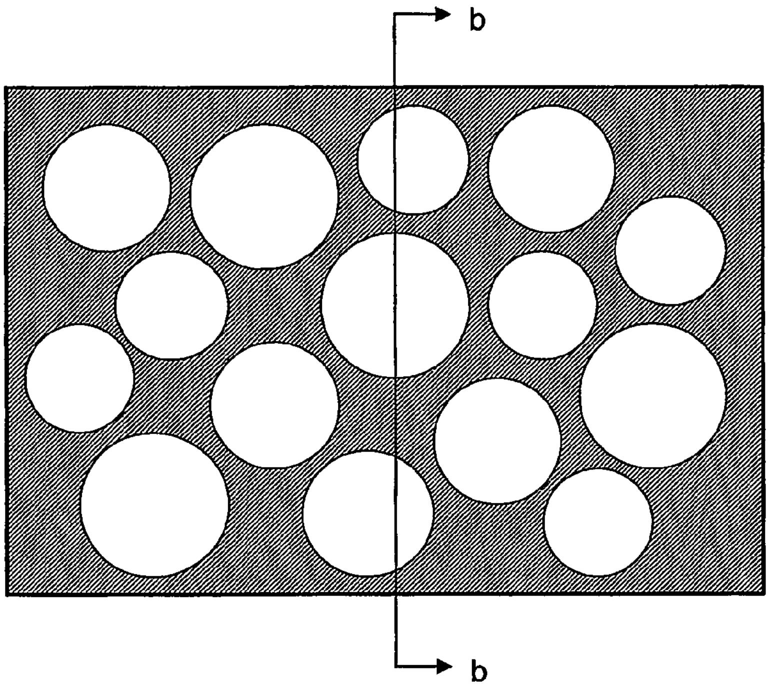
Figure 12B:
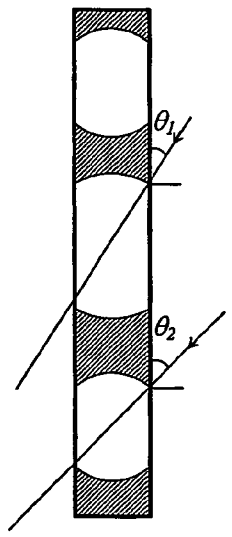

In the above-described embodiments the transparent and non-transparent areas of the optical element are arranged in a mutually regular pattern, eg such that all openings are of the same size and arranged with the same mutual distance. However, nothing prevents the use of a more irregular structure, wherein eg apertures of different sizes are arranged more randomly between each other, if only the remaining requirements to invisibility, etc, continue to be observed. Such irregular structure will further present the advantage that the transition between the angles, where light is allowed to travel through the optical element, and the angles, where the passage of light is blocked, becomes less abrupt. In case of small dimensions it also renders the optical element less sensitive to diffraction phenomena. One example of such optical element is shown in FIGS. 12*a-b*, wherein FIG. 12*a* shows the plate seen straight from the front, while FIG. 12*b* is a sectional view through the line b-b shown in FIG. 12*a*.

Apart from the already mentioned methods, an element like the one shown in FIG. 12 can also be manufactured in a variety of ways, such as by photographic reproduction, in a foaming process or by beads being dispersed across a surface following which they are attached by sintering onto the glass. Examples of this will be described below. It is a characterising feature of elements produced in a number of these manufacturing methods that location and size of the apertures thus formed cannot be described by means of a single factor, but rather they are to be perceived as a statistical distribution through an interval and across a face. Both the size distribution and the distribution across the face depend on the selected manufacturing methods. By these methods it will thus only be possible to define the shielding angle as a distribution, which is, in FIG. 12, symbolised by the angles $\theta_1$ and $\theta_2$. The product will still have the same macroscopic property as light-shielding element, albeit the transition from incidence to shielding will be less well-defined than was the case with the above-described regular patterns.

One example of the manufacturing of such irregular optical element is photographic reproduction, which is a manufacturing method that may be of interest when it comes to mass production of elements. Here, it will typically be a controlled geometry, ie the geometry may very well be irregular, eg in the form of apertures of different sizes, but still they are well-defined in advance.

A shielding element with controlled geometry may be provided by photographic techniques, eg by ultra-violet or X-ray lithography. The element may be provided on a substrate of flexible plastics or on a solid substrate, eg glass. The element may eg be provided by application of a light-absorbing resin on a suitably selected substrate in a layer corresponding to the thickness of the desired shielding. This layer is cured with the desired pattern by exposing the resin to radiation through a mesh with the desired pattern, eg by ultra-violet light or X-ray irradiation. Hereby the resin is cured in the radiated areas, while the non-radiated areas can subsequently be removed by immersion of the entire face into a suitably selected solvent.

The thus produced shielding element is not per se active as solar cell; rather it is exclusively a passive sun-shielding element. Alternatively the above-referenced method can be used for de-meshing a layer of metal that can subsequently be used for manufacturing a solar-cell active sun shielding. This can be accomplished by the following method.

This process takes its starting point in a metal foil, eg 50-75 μm copper or other metal. The metal is applied on both sides with a layer of photo-active varnish that can be cured by irradiation with ultra-violet rays, X-ray irradiation or the like. This varnish is cured by irradiation through a mesh corresponding to the geometry it is desired to reproduce in the product and the non-cured varnish is removed in accordance with usual procedures in these techniques. Also a reversed process is available, wherein it is the cured varnish that can subsequently be removed; this method is equivalent to the other—the only difference being that it is necessary to radiate through a mesh corresponding to a negative imprint of the desired structure. Following removal of the varnish in selected areas, the exposed copper surface is removed by etching with a suitable etching agent, whereas that part of the copper face that is protected by the varnish remains unaltered. Following etching the applied, cured varnish is removed by usual methods, and the pure, patterned copper structure will appear. This copper face can subsequently be used as support for a thin-film solar cell of eg CIGS type, wherein the application of the layers in the CIGS cell takes place electrolytically or by usual vacuum-deposition (Chemical Vapour Deposition or Physical Vapour Deposition) methods. The film-solar cell thus produced is subsequently to be laminated onto either glass or plastics. This, too, can be accomplished by usual lamination techniques.

In the above-mentioned techniques it is an option to use other metals than copper, eg silicon; the requirements to be complied with by the metal is that it has to be suitable for the further processing into solar cell, and it has to be able to tolerate chemical process by suitable etching techniques. Likewise, it is of course also an option to employ other thin-film solar cells apart from CIGS, eg amorphous silicon, CdTe or other. The above-described solar cells, wherein photo-electrode or counter electrode are configured as an optical element according to the invention, may, of course, also be manufactured with such controlled, irregular structure.

Manufacturing methods are also available, wherein the irregular structure is not controlled and well-defined in advance. A few examples where the desired, light-regulating microstructure in the optical element is provided by mechanisms that do not directly involve mechanical or optical processing of the structure will be described in the following, exemplified by the manufacture of a light-regulating nc-DSC solar cell, wherein the photo-electrode of the solar cell constitutes the light-regulating element.

A structured photo-electrode can be provided by methods without direct mechanical working in a foaming process of a paste consisting of $TiO_2$ particles. The foaming is provided by mixing $TiO_2$ particles with a suitable polymer binding system. The mixed substance can be foamed by various methods that are all known techniques for foaming polymer structures, eg admixture of reagent that generates a gas-forming reaction with a polymer component, or by blowing an inert gas into the polymer mixture. The thus foamed substance is spread across a suitable substrate, eg glass with a conductive coating, and the thickness of the thus spread layer is adjusted to the desired thickness of the finished photo-electrode. The spreading can be performed by a rolling with a stationary smooth cylinder or the like known technology. Following curing of the binding agent, it is removed by thermal decomposition and leaves a micro-structured surface that corresponds to the cavities that were originally formed in the foaming process. Due to the surface tension of the liquid, the foaming process will result in the upper layer of the electrode being approximately closed. It is consequently necessary that the uppermost layer of the electrode thus manufactured is removed by a suitable mechanical processing across the entire face, eg by a planing or sanding process.

By this method the size of the formed cavities should exceed the thickness of the finished electrode, such that an excessively thick layer is applied that can subsequently be removed mechanically. By this method, the size of the apertures in the structure can be controlled within an interval, and therefore the method results in a product that has more than one cut-off angle for the directly incident light. The passage of light through the structure can thus be described by describing the geometry of the porosities statistically by a norm size and spreading.

A structured surface can also be manufactured by manufacture of a suspension of $TiO_2$ nano-particles and adding thereto a suitable amount of uniform particles with well-defined size and geometry, eg bead-shaped. These particles can be made of eg wax, polymer or other combustible or readily convertible material. The size of the added particles is selected to be such that they slightly exceed the desired thickness of the finished electrode. Then the described mixture is used to cast a film on a suitable substrate, and this film is spread such that a mono-layer of the mentioned, added particles is left behind. Following drying and optionally curing, binder and the added particles are removed by thermal treatment. Simultaneously, the $TiO_2$ particles of the electrodes are sintered to each other. In order to ensure an open structure, the upper layer of this film is removed by suitably selected mechanical processing. In this manner it is possible to produce a micro-structured surface, wherein each of the formed apertures in the face has a well-defined geometry. The method involves only indirect control of the location of these apertures, but it will be such that—in case a sufficient amount of particles are added, eg beads of a uniform size to the mixture—they will arrange almost regularly in an approximately triagonal pattern.

A variation in the manufacture of a structured ceramic surface is achieved by applying onto a suitable substrate, eg glass, a polymer matrix with a geometry corresponding to a negative relief of the structure desired to obtain in the ceramic material. It can be provided eg by filling the surface with bead-shaped particles of low-melting plastics, wax or the like, such that they form a monolayer. The substrate is subsequently heated with a view to adhering the particles onto the structure by melting, and forming a plane face between the particles and the substrate. Then a suspension of $TiO_2$ or graphite is applied on top of and between the polymer structure, and drying of the suspension is performed. Then the polymer structure is removed by suitably selected thermal treatment. Thus it is possible to form a face with a well-defined geometry.

The above-referenced methods can be used for the manufacture of film that constitutes the photo- or counter electrode in a nc-DSC solar cell, or they can be used for structuring non-solar-cell-active materials, such as inorganic coatings of ceramics, metal or the like. In the latter case, the product is merely a sun-shield.

Albeit preferred embodiments of the present invention have been described and shown, the invention is not limited to such; rather it may assume other configurations within the scope of the appended claims.

The invention claimed is:

1. A solar cell comprising an optical element having both transparent areas and substantially non-transparent areas disposed along a surface of the optical element, wherein the transparent areas are arranged such that individual, intermediate, substantially non-transparent areas have an extent that is less than 1 mm in at least one direction in the plane of said surface;

the substantially non-transparent areas are arranged close to each other and extend at right angles to said surface such that the transparent areas have a depth/width ratio that causes the optical element to allow, at a given point on said surface, passage of light with given angles of incidence, while light having other angles of incidence is unable to pass through the optical element at the given point;

the substantially non-transparent areas have openings filled by the transparent areas;

the transparent areas and the substantially non-transparent areas are located in the same plane; and at least a part of the substantially non-transparent areas is configured for functioning as an electrode in the solar cell.

2. The solar cell according to claim 1, characterised in that said substantially non-transparent areas form a continuous face, such that the transparent areas appear as openings in the continuous face.

3. The solar cell according to claim 2, characterised in that said openings are elongate, whereby they have, in a given direction in a plane of the continuous face, an extent that exceeds the extent in a direction at right angles thereto in the plane of the continuous face.

4. The solar cell according to claim 1, characterised in that said transparent areas constitute a continuous face, such that the substantially non-transparent areas appear as islands in the continuous face.

5. The solar cell according to claim 1, characterised in that the transparent areas and the substantially non-transparent areas are arranged in a mutually regular pattern.

6. The solar cell according to claim 1, characterised in that the transparent areas have, at least in one direction in the plane of the face, an extent that is a maximum ten times the extent of the substantially non-transparent areas at right angles to the face.

7. The solar cell according to claim 1, characterised in that the transparent areas are arranged such that the individual, intermediate, substantially non-transparent areas have an extent that, at least in one direction in the plane of the face, is less than 100 μm.

8. The solar cell according to claim 1, characterised in that the substantially non-transparent areas include any combination of a particulate semiconductor material and a particulate metallic material.

9. The solar cell according to claim 1 characterised in that that it is configured as a film that can be attached to a surface on another optical element.

10. The solar cell according to claim 1, characterised in that it is configured as an integral part of a window pane.

11. The solar cell according to claim 1, characterised in that said solar cell is a photo-electro-chemical solar cell.

12. The solar cell according to claim 11, characterised in that the substantially non-transparent areas comprise a semiconductor, on which a suitable dye is adsorbed, and are configured for functioning as a photo-electrode.

13. The solar cell according to claim 11, characterised in that the substantially non-transparent areas comprise electrically conductive particulate material and are configured for functioning as a counter electrode.

14. The solar cell according to claim 1, characterised in that the substantially non-transparent areas comprise surfaces functioning as a carrier for the solar cells.

15. The solar cell according to claim 14, characterised in that the solar cell is configured as a thin-film solar cell.

16. The solar cell according to claim 1, wherein the transparent areas include a transparent substrate.

17. The solar cell according to claim 1, wherein the substantially non-transparent areas are configured as lamellae having a triangular cross section.

18. The solar cell according to claim 17, wherein the lamellae have a depth (D), a thickness (T) and a mutual distance (A) exceeding 10 μm, the mutual distance (A) being a distance between two adjacent lamellae.

19. The solar cell according to claim 1, wherein the substantially non-transparent areas are configured as tilted lamellae.

* * * * *